(12) United States Patent
Grupp et al.

(10) Patent No.: US 9,583,614 B2
(45) Date of Patent: Feb. 28, 2017

(54) INSULATED GATE FIELD EFFECT TRANSISTOR HAVING PASSIVATED SCHOTTKY BARRIERS TO THE CHANNEL

(71) Applicant: Acorn Technologies, Inc., La Jolla, CA (US)

(72) Inventors: Daniel E. Grupp, San Francisco, CA (US); Daniel J. Connelly, San Francisco, CA (US)

(73) Assignee: Acorn Technologies, Inc., La Jolla, CA (US)

( * ) Notice: Subject to any disclaimer, the term of this patent is extended or adjusted under 35 U.S.C. 154(b) by 0 days.

(21) Appl. No.: 14/298,810

(22) Filed: Jun. 6, 2014

(65) Prior Publication Data
US 2014/0284666 A1    Sep. 25, 2014

Related U.S. Application Data

(60) Continuation of application No. 13/757,597, filed on Feb. 1, 2013, now Pat. No. 8,916,437, which is a
(Continued)

(51) Int. Cl.
*H01L 21/338* (2006.01)
*H01L 29/78* (2006.01)
(Continued)

(52) U.S. Cl.
CPC .... *H01L 29/7827* (2013.01); *H01L 21/28537* (2013.01); *H01L 29/0895* (2013.01);
(Continued)

(58) Field of Classification Search
CPC ........... H01L 29/7827; H01L 21/28537; H01L 29/66666; H01L 29/456; H01L 29/47;
(Continued)

(56) References Cited

U.S. PATENT DOCUMENTS 3,513,366 A    5/1970    Clark
3,590,471 A    7/1971    Lepselter et al.
(Continued)

FOREIGN PATENT DOCUMENTS

EP    0295490 A1    12/1988
EP    0789388 A2    8/1997
(Continued)

OTHER PUBLICATIONS

"Research Achievements", Research Achievements at RCIQE, downloaded Apr. 12, 2002, from: http://www.rciqe.hokudai.ac.jp/RCIQEold/ResearchAchievements.html, 8 pgs.
(Continued)

*Primary Examiner* — Stephen W Smoot
*Assistant Examiner* — Vicki B Booker
(74) *Attorney, Agent, or Firm* — Ascenda Law Group, PC

(57) ABSTRACT

A transistor having at least one passivated Schottky barrier to a channel includes an insulated gate structure on a p-type substrate in which the channel is located beneath the insulated gate structure. The channel and the insulated gate structure define a first and second undercut void regions that extend underneath the insulated gate structure toward the channel from a first and a second side of the insulated gate structure, respectively. A passivation layer is included on at least one exposed sidewall surface of the channel and metal source and drain terminals are located on respective first and second sides of the channel, including on the passivation layer and within the undercut void regions beneath the insulated gate structure. At least one of the metal source and drain terminals comprises a metal that has a work function near a valence band of the p-type substrate.

4 Claims, 7 Drawing Sheets

Related U.S. Application Data continuation of application No. 13/022,559, filed on Feb. 7, 2011, now Pat. No. 8,377,767, which is a continuation of application No. 11/403,185, filed on Apr. 11, 2006, now Pat. No. 7,883,980, which is a continuation of application No. 10/754,966, filed on Jan. 9, 2004, now Pat. No. 7,112,478, which is a division of application No. 10/342,576, filed on Jan. 14, 2003, now Pat. No. 6,833,556, which is a continuation-in-part of application No. 10/217,758, filed on Aug. 12, 2002, now Pat. No. 7,084,423.

(51) Int. Cl.
| | |
|---|---|
| H01L 21/285 | (2006.01) |
| H01L 29/08 | (2006.01) |
| H01L 29/45 | (2006.01) |
| H01L 29/47 | (2006.01) |
| H01L 29/49 | (2006.01) |
| H01L 29/66 | (2006.01) |
| H01L 29/812 | (2006.01) |
| H01L 29/786 | (2006.01) |

(52) U.S. Cl.
CPC ............ *H01L 29/456* (2013.01); *H01L 29/47* (2013.01); *H01L 29/4908* (2013.01); *H01L 29/66143* (2013.01); *H01L 29/66636* (2013.01); *H01L 29/66643* (2013.01); *H01L 29/66666* (2013.01); *H01L 29/66772* (2013.01); *H01L 29/66795* (2013.01); *H01L 29/7839* (2013.01); *H01L 29/812* (2013.01); *H01L 29/8126* (2013.01); H01L 29/78 (2013.01); H01L 29/785 (2013.01); H01L 29/78696 (2013.01); Y10S 438/958 (2013.01)

(58) Field of Classification Search
CPC ........... H01L 29/4908; H01L 29/66143; H01L 29/66636; H01L 29/66643; H01L 29/66772; H01L 29/66795; H01L 29/7839; H01L 29/812; H01L 29/8126; H01L 29/0895

See application file for complete search history.

(56) References Cited

U.S. PATENT DOCUMENTS

| | | | |
|---|---|---|---|
| 3,708,360 | A | 1/1973 | Wakefield, Jr. et al. |
| 3,983,264 | A | 9/1976 | Schroen et al. |
| 3,983,574 | A * | 9/1976 | Statz ................... H01J 9/233 257/461 |
| 4,019,113 | A | 4/1977 | Hartman |
| 4,056,642 | A | 11/1977 | Saxena et al. |
| 4,300,152 | A | 11/1981 | Lepselter |
| 4,422,090 | A | 12/1983 | Shepherd et al. |
| 4,485,550 | A | 12/1984 | Koeneke et al. |
| 4,583,110 | A | 4/1986 | Jackson et al. |
| 4,723,197 | A | 2/1988 | Takiar et al. |
| 4,811,077 | A | 3/1989 | Fowler et al. |
| 4,843,029 | A | 6/1989 | Joyce et al. |
| 5,021,365 | A | 6/1991 | Kirchner et al. |
| 5,027,166 | A | 6/1991 | Ohtsuka et al. |
| 5,098,859 | A | 3/1992 | Jackson et al. |
| 5,308,998 | A | 5/1994 | Yamazaki et al. |
| 5,399,206 | A | 3/1995 | De Lyon |
| 5,438,210 | A | 8/1995 | Worley |
| 5,578,848 | A | 11/1996 | Kwong et al. |
| 5,596,218 | A | 1/1997 | Soleimani et al. |
| 5,608,266 | A | 3/1997 | Agnello et al. |
| 5,612,567 | A | 3/1997 | Baliga |
| 5,663,584 | A | 9/1997 | Welch |
| 5,801,398 | A | 9/1998 | Hebiguchi |
| 5,801,444 | A | 9/1998 | Aboelfotoh et al. |
| 5,888,891 | A | 3/1999 | Gould |
| 5,908,313 | A | 6/1999 | Chau et al. |
| 5,939,763 | A | 8/1999 | Hao et al. |
| 5,943,575 | A | 8/1999 | Chung et al. |
| 6,011,271 | A | 1/2000 | Sakuma et al. |
| 6,037,605 | A | 3/2000 | Yoshimura |
| 6,064,082 | A | 5/2000 | Kawai et al. |
| 6,071,783 | A | 6/2000 | Liang et al. |
| 6,091,076 | A | 7/2000 | Deleonibus et al. |
| 6,096,590 | A | 8/2000 | Chan et al. |
| 6,117,781 | A | 9/2000 | Lukanc et al. |
| 6,150,286 | A | 11/2000 | Sun et al. |
| 6,198,113 | B1 | 3/2001 | Grupp |
| 6,207,976 | B1 | 3/2001 | Takahashi et al. |
| 6,261,932 | B1 | 7/2001 | Hulfachor |
| 6,291,282 | B1 | 9/2001 | Wilk et al. |
| 6,291,866 | B1 | 9/2001 | Wallace et al. |
| 6,291,867 | B1 | 9/2001 | Wallace et al. |
| 6,293,137 | B1 | 9/2001 | Liu et al. |
| 6,303,479 | B1 | 10/2001 | Snyder |
| 6,326,294 | B1 | 12/2001 | Jang et al. |
| 6,339,232 | B1 | 1/2002 | Takagi |
| 6,344,673 | B1 | 2/2002 | Aussilhou |
| 6,380,021 | B1 | 4/2002 | Wang et al. |
| 6,452,244 | B1 | 9/2002 | Miura et al. |
| 6,462,931 | B1 | 10/2002 | Tang et al. |
| 6,548,875 | B2 | 4/2003 | Nishiyama |
| 6,608,352 | B1 | 8/2003 | Long et al. |
| 6,680,224 | B2 | 1/2004 | Shin et al. |
| 6,724,068 | B2 | 4/2004 | Matsuyama |
| 6,724,088 | B1 | 4/2004 | Jammy et al. |
| 7,084,423 | B2 | 8/2006 | Grupp et al. |
| 7,176,483 | B2 | 2/2007 | Grupp et al. |
| 8,110,877 | B2 | 2/2012 | Mukherjee et al. |
| 8,952,541 | B2 | 2/2015 | Mukherjee et al. |
| 2001/0028067 | A1 | 10/2001 | Awano |
| 2002/0061646 | A1 | 5/2002 | Kan et al. |
| 2002/0158250 | A1* | 10/2002 | Fujisaki ............ H01L 21/28185 257/64 |
| 2003/0009463 | A1 | 1/2003 | Gallant |
| 2003/0012146 | A1 | 1/2003 | Novaes |
| 2003/0121468 | A1 | 7/2003 | Boone et al. |
| 2003/0127700 | A1 | 7/2003 | Moddel et al. |
| 2003/0132466 | A1 | 7/2003 | Shin et al. |
| 2003/0235936 | A1 | 12/2003 | Snyder et al. |
| 2004/0026687 | A1 | 2/2004 | Grupp et al. |
| 2004/0142524 | A1 | 7/2004 | Grupp et al. |
| 2005/0009302 | A1 | 1/2005 | Wakui et al. |
| 2005/0037557 | A1 | 2/2005 | Doczy et al. |
| 2005/0093027 | A1 | 5/2005 | Grupp et al. |
| 2011/0092047 | A1 | 4/2011 | Gaines et al. |

FOREIGN PATENT DOCUMENTS

| | | |
|---|---|---|
| WO | WO 2004/015782 A1 | 2/2004 |
| WO | WO 2004/030104 A1 | 4/2004 |

OTHER PUBLICATIONS

Aberle, Armin G., et al., "Injection-Level Dependent Surface Recombination Velocities at The Silicon-Plasma Silicon Nitrite Interface", Institute fur Solarenergieforschung, ISFH, D-3 1860 Emmerthal, Germany, (Mar. 9, 1995), pp. 2828-2830.

Aboelfotoh, "Influence of thin interfacial silicon oxide layers on the Schottky-barrier behavior of Ti on Si(100)", Phys Rev B Condens Matter (Mar. 1989), 39(8):5070-5078.

Acorn Technologies, Inc., International Search Report and Written Opinion, PCT/US2005/030209 Mar. 2, 2006, 8 pp.

Adam; et al., "Experimental Identification of Nitrogen-Vacancy Complexes in Nitrogen Implanted Silicon", Applied Physics Letters (Jul. 2001), 79(5):623-625.

Alers; et al., "Effects of Thermal Stability and Roughness on Electrical Properties of Tantalus Oxide Gates", MRS Proceedings (1999), 567:391-395.

Almeida; et al., "Reaction-Diffusion Model for Thermal Growth of Silicon Nitrite Films on Si", Physical Review B (Dec. 2000), 62(24):R16255-R16258.

(56) References Cited

OTHER PUBLICATIONS

Bannikov; et al., "Field-Effect Transistor With Metal-(Tunneling-Insulator)-Semiconductor Contacts and a Gate Insulator Made of a Mangmuir-Blodgett Film", Soviet Technical Physics Letters (Mar. 1989), 15(3):211-212.
Bauernschmitt, et al., "Transition from MOS to Schottky-contract behaviour in Yb—SiO2—Si Tunneling Junctions with extremely thin SiO2 layer", Microelectronic Engineering (1993), 22:105-108.
Baumvol, "Atomic Transport During Growth of Ultrathin Dielectrics on Silicon", Surface Science Reports (Dec. 1999), 36(1-8):1-166.
Berger, "Contact Resistance and Contact Resistivity" J. Electrochem. Soc.: Solid-State Science and Technology (1972), 119(4):507-514.
Blosse; et al., "A Novel Low Cost 65nm CMOS Process Architecture With Self Aligned Isolation and W Cladded Source/Drain", IEEE, Transactions of 2004 International Electron Device Meeting (Jan. 2005), pp. 669-672.
Bringans, "Arsenic Passivation of Si and Ge Surfaces", Critical Reviews in Solid State and Materials Sciences I(1992), 17(4):353-395.
Cai; et al., "Investigation of the Properties of Plasma-Enhanced Chemical Vapor Deposition Silicon Nitride and its Effect on Silicon Surface Passivation", Journal of Applied Physics (May 1998), 83(11):5885-5889.
Card; et al., "Studies of tunnel MOS diodes I. Interface effects in silicon Schottky diodes", Journal of Physics D: Applied Physics (1971), 4(10):1589-1601.
Chadi; et al., "Fermi-Level-Pinning Defects in Highly n-Doped Silicon", Physical Review Letters (Dec. 1997), 79(24):4834-4837.
Chaneliere; et al., "Tantalum Pentoxide (Ta2O5) Thin Films for Advanced Dielectric Applications"; Materials Science and Engineering, R: Reports (May 1998), 22(6):269-322.
Chen; et al., "High Quality Native-Oxide-Free Ultrathin Oxide Grown by In-Situ HF-Vapor Treatment", Electronic Letters, (May 2000), 36(11):981-983.
Connelly; et al., "Optimizing Schottky S/D Offset for 25-nm Dual-Gate CMOS Performance", Electron Device Letters, IEEE (Jun. 2003), 24(6)411-413.
Edelstein; et al., "Full Copper Wiring in a Sub-0.25 mm CMOS ULSI Technology", Proceedings of the IEEE International Electron Device Meeting (1997), pp. 773-776.
Gilmer; et al., "Process and Manufacturing Challenges for High-K Gate Stack Systems", MRS Proceedings, MRS Spring Meeting (1999), 567:323-341.
Gopalakrishnan; et al., "Impact Ionization MOS (I-MOS)-Part I: Device and Circuit Simulations", IEEE Transactions Electron Devices (Jan. 2005), 52(1):69-76.
Hara, et al., "Control of Schottky and Ohmic Interfaces by Unpinning Fermi Level", Applied Surface Science (1997), 117-118:394-399.
Hara; et al., "Pinning-Controlled Metal/Semiconductor Interfaces", Proc. SPIE 2779, 3rd International Conference on Intelligent Materials and 3rd European Conference on Smart Structures and Materials (Apr. 1996), 2779:802-807.
Hara; et al., "Pinning-Controlled Ohmic Contacts: Application to SiC(0001)", Applied Surface Science (Nov. 1996), 107:218-221.
Hasegawa; et al., "Unpinning of Fermi Level in Nanometer-Sized Schottky Contacts on GaAs and InP", Applied Surface Science (2000): 166:92-96.
Hayafuji; et al., "Nitridation of Silicon and Oxidized-Silicon", J. Electrochem. Soc. (1982), 129(9):2102-2108.
Heine, "Theory of Surface States", Physical Review (Jun. 1965), 138(6A):83-4.
Hilsenbeck; et al., "Aging Behavior of Algan HFETs With Advanced Ohmic and Schottky Contacts", Electronic letters (May 2000), 38(11):980-981.
Huang, "Metal-Oxide Semiconductor Field-Effect Transistors Using Schottky Barrier Drains", Electronics Letters (1797), 33(15):1341-1342.
Huang; et al., "Two-Dimensional Numerical Simulation of Schottky Barrier MOSFET with Channel Length to 10 nn", IEEE (Apr. 1998), pp. 842-848.
International Search Report, PCT/US03/25057, Mailing Date Dec. 18, 2003, 4 pgs.
International Search Report, PCT/US2004/042084, Mailing date Sep. 1, 2005, 4 pgs.
Izumi, "43 Hydrogen Termination: The Ideally Finished Silicon Surface", Ultraclean Surface Processing of Silicon Wafers (1998), pp. 559-565.
Kamins; et al., "Effect of Hydrogen on p-Type Epitaxial Silicon Sheet-Resistance Measurements", Electrochemical and Solid-State Letters (1998), 1(2):100-101.
Kamiyama; et al., "Ultrathin Tantalum Odise Capacitor Dielectric Layers Fabricated Using Rapid Thermal Nitridation Prior to Low Pressure Chemical Vapor Deposition", J. Electrochem Soc. (1993), 140(6)1617.
Kaxiras, "Efthimios. Semiconductor-surface restoration by valence-mending adsorbates: Application to Si (100): S and Si (100): Se", Phys Rev B Condens Matter (Mar. 1991), 43(18):6824-6827.
Kedzierski; et al., "Extension and Source/Drain Design for High-Performance FinFET Devices", IEEE Trans. Electron Devices (Apr. 2003), 50(4):952-958.
Keller; et al., "Calculations of the barrier height and charge distribution of a metal-dielectric interface", Journal of Vacuum Science & Technology A: Vacuum, Surfaces, and Films (Jul. 1992), 10(4):775-780.
Kim; et al., "Metal-Dependent Fermi-Level Movement in the Metal/Sulfer-Passivated InGaP Contact", Journal of Vacuum Science & Technology A: Vacuum, Surfaces, and Films (1997), 15(3):1124-1128.
Kimura; et al., "A New Type of Schottky Tunnel Transistor", IEEE Electron Device Letters (Oct. 1994), 15(10): 412-414.
Lee; et al., "Electronic Property of Metallic Nanoclusters on Semiconductor Surfaces: Implications for Nanoelectronic Device Applications", Journal of Nanoparticle Research (Dec. 2000), 2(4):345-362.
Louie; et al., "Ionicity and the Theory of Schottky Barriers", Physical Review B (Feb. 1977), 15(4):2154-2162.
Mandelis; et al., "Evidence of a Surface Acceptor State in Undoped Semi-Insulating GaAs by Photothermal Radiometric Deep Level Transient Spectroscopy", Sociedad Mexicana de Ciencias de Superficies y de Vacio, (1999), 8:13-17.
Martel; et al., "Ambipolar Single-Wall Carbon Nanotube Transistors and Inverters", AIP Conference Proceedings (Mar. 2001). 591:543-547.
McKee; et al., "Physical Structure and Inversion Charge at a Semiconductor Interface With a Crystalline Oxide", Science (Jul. 2001), 293(5529):468-471.
Miyawaki; et al., "Improvement of Aluminum—Si Contact Performance in Native-Oxide-Free Processing", IEEE Electron Device Letters (Oct. 1990), 11(10):448-450.
Nauka; et al., "Surface Photovoltage Measurement of Hydrogen-Treated Si Surfaces", Journal of Electrochemical Society (1999), 146(1):292-295.
Nishioka; et al., "Dielectric Characteristics of Fluorinated Ultradry SiO2", Appl. Phy. Letters (Mar. 1989), 54(12):1127-1129.
Okamoto; et al., "Near-Ohmic Contact of n-GaAs with GaS/GaAs Quaisi-Metal-Insulator-Semiconductor Structure", Jpn. J. Appl. Phys. (1998), 37:3248-3251.
Padovani, "Forward Voltage-Current Characteristics of Metal-Silicon Schottky Barriers", Journal of Applied Physics (1967), 38(2):891-892.
Park; et al., "Thermal stability of molybdenum-silicon nitride-silicon Schottky diodes", Journal of Applied Physics (Mar. 1991), 69(5):3149-3153.
Patel; et al., "Arsenic Atom Location on Passive Silicon (111) Surfaces", Physical Review B (Nov. 1987), 36(14):7715-17.
Porter; et al., "A Critical Review of Ohmic and Rectifying Contacts for Silicon Carbide", Material Science and Engineering: B (Nov. 1995), 34(2-3):83-105.

(56) References Cited

OTHER PUBLICATIONS

Ren; et al. "Metal I Silicon Schottky Barrier Lowering by RTCVD Interface Passivation" Electrochemical Society Proceedings (2000), 2000-9:161-166.
Ruzyllo; et al., "Semiconductor Glossary an Introduction to Semiconductor Terminology", Prosto Multimedia Publishing (2004), pp. 26.
Schmidt; et al., "Carrier Recombination at Silicon—Silicon Nitride Interfaces Fabricated by Plasma-Enhanced Chemical Vapor Deposition", Journal of Applied Physics (Apr. 1999), 85(7):3626-3633.
Shalish; et al., "Yellow Luminescence and Fermi Level Pinning in GaN Layers", Appl Phys Lett (Aug. 2000), 77(7):987-989.
Snyder; et al., "Experimental Investigation of a PtSi Source and Drain Field Emission Transister", Appl Phys Lett (1995), 67:1420-1422.
Sobolewski; et al., "Properties of Ultrathin Thermal Nitrides in Silicon Schottky Barrier Structures", Applied Physics Letters, American Institute of Physics (1989), 54(7):638-640.
Sobolewski; et al., "Studies of barrier height mechanisms in metal-silicon nitride-silicon Schottky barrier diodes", Journal of Vacuum Science & Technology B (1989), 7:971-979.
Spicer; et al., "Unified Mechanism for Schottky-Barrier Formation and III-V Oxide Interface States", Physical Review Letters (Feb. 1980), 44(6):420-423.
Sze, "Metal-Semiconductor Contacts", Physics of Semiconductor Devices, John Wiley & Sons, (1981), pp. 245-311.
Takahagi; et al., "The formation of hydrogen passivated silicon singlecrystal surfaces using ultraviolet cleaning and HF etching", J Appl Phys (1988), 64(7):3516-21.
Tao; et al., "Removal of dangling bonds and surface states on silicon (001) with a monolayer of selenium", Applied Physics Letters (Mar. 2003), 82(10)1559-1561.
Tao; et al., "Suppression of silicon (001) surface reactivity using a valence-mending technique", Solid State Communications (Oct. 2004), 132(2):89-92.
Taubenblatt; et al., "Interface effects in titanium and hafnium Schottky barriers on silicon", Appl Phys Lett (May 1984), 44:895-897.
Teraji; et al., "Ohmic Contacts to n-Type 6H-SiC Without Post-Annealing", Material Research Society, MRS Spring Meeting (1996), 423:149-154.
Tersoff, "Schottky Barrier Heightsand the Continuum of Gap States", Physical Review Letters (Feb. 1984), 52(6):465-468.
Thanailakis; et al., "Transition-metal contacts to atomically clean silicon, Department of Electrical Engineering and Electronics", Journal of Physics C: Solid State Physics (1976), 9:337-343.
Thompson; et al., "A Logic Nanotechnology Featuring Strained-Silicon", IEEE Electron Device Letters (Apr. 2004),25(4):191-193.
Tung, "Electron Transport of Inhomogeneous Schottky Barriers", Appl Phys Letter (1991), 58(24):2821-2823.
Udeshi; et al., "Thermal stability of ohmic contacts between Ti and Sepassivated n-type Si(001)", J Appl Phys (2004), 95(8):4219-4222.

Uemoto, "Reduction of Ohmic Contact Resistance on N-Type 6H-SIC by Heavy Doping", Japanese Journal of Applied Physics (Jan. 1995), 34(Parts 2, No. 1A).
Verhaverbeke; et al., "Surface Characterization of Si After HF Treatments and its Influence in the Dielectric Breakdown of Thermal Oxides", MRS Proceedings (1992), 259:391-399.
Wang; et al., "High Barrier GaN Schottky Diodes: Pt/GaN and Pd/GaN", Appl. Phys. Letters (Feb. 1996), 68(9):1267-1270.
Wei; et al., "The Use of Selective Electroless Metal Deposition for Micron Size Contact Fill", IEEE International Electron Device Meeting Technical Digest (1988), pp. 446-449.
Weinberger; et al., "Surface Chemistry of HF Passivation Silicon: X-Ray Photoelectron and Ion Scattering Spectroscopy Results", J. Appl. Phys (Nov. 1986), 60(9):3232-34.
Widjaja; et al., "Ab Initlo Study and Decomposition of NH3 on Si(100)-(2×1)", J. Phy. Chem B, (2000), 104:2527-2533.
Wittmer; et al., "Ideal Schottky diodes on passivated silicon", Phys Rev Lett (Nov. 1992), 69(18):2701-2704.
Wolf; et al., "Spintronics: A Spin-Based Vision for the Future", Science (Nov. 2001), 294(5546):1488-95.
Wright; et al., "Hot-Electron Immunity of SiO2 Dielectrics with Fluorine Incorporation", IEEE Electron Device Letters (1989), 10(8):347-348.
Yablonovitch; et al., "Unusually Low Surface-Recombination Velocity on Silicon and Germanium Surfaces", Physical Review Letters (Jul. 1986), 57(2):249-252.
Yagishita; et al., "High Performance Damascene Metal Gate MOSFET's for 0.1 mm Regime", IEEE Trans. Electron Devices (2000), 47(5):1028-1034.
Yang; et al., "The Effects of Interfacial Sub-Oxide Transition Regions and Monolayer Level Nitridation on Tunneling Currents in Silicon Devices", IEEE Electron Device Letters (2000), 21(2):76-78.
Zhang; et al., "Schottky diodes of NiÕAu on n-GaN grown on sapphire and SiC substrates", Applied Physics Letters (Oct. 2001), 79(16):2567-69.
Zhu; et al., "Low-Resistance Ti/n-Type Si(100) Contacts by Monolayer Se Passivation", ECS Trans (2006), 2(2):401-409.
Zhu; et al., "Stability of Se passivation layers on Si(001) surfaces characterized by time-of-flight positron annihilation induced Auger electron spectroscopy", Journal of Applied Physics (2005), 97(10):103510-1103510-4.
Acorn Technologies, Inc., International Application No. PCT/US2012/060893 filed Oct. 18, 2012, ISA/US, International Search Report and Written Opinion, Dec. 11, 2012, 23 pages.
"Patents Act 1977: Examination Report under Section 18(3)", UK Intellectual Property Office dated Apr. 29, 2015, Application No. GB1409999.8 (filed Oct. 18, 2012), 5 pgs.
McKinley; et al., "Control of Ge homojunction band offsets via ultrathin Ga—As dipole layers", Applied Surface Science (1992), 56-58(Part 2):762-765.
McKinley; et al., "Controlled modification of heterojunction band lineups by diffusive intralayers", Journal of Vacuum Science & Technology A Vacuum Surfaces and Films (May/Jun. 1990), 8(3):1917-21.

\* cited by examiner

INSULATED GATE FIELD EFFECT TRANSISTOR HAVING PASSIVATED SCHOTTKY BARRIERS TO THE CHANNEL

RELATED APPLICATIONS

The present application is a CONTINUATION of copending U.S. patent application Ser. No. 13/757,597, filed Feb. 1, 2013, incorporated herein by reference, which is a continuation of U.S. patent application Ser. No. 13/022,559, filed Feb. 7, 2011, now U.S. Pat. No. 8,377,767, incorporated herein by reference, which is a continuation of U.S. patent application Ser. No. 11/403,185, filed Apr. 11, 2006, now U.S. Pat. No. 7,883,980, incorporated herein by reference, which is a continuation of U.S. patent application Ser. No. 10/754,966, filed Jan. 9, 2004, now U.S. Pat. No. 7,112,478, which is a divisional of U.S. patent application Ser. No. 10/342,576, filed Jan. 14, 2003, now U.S. Pat. No. 6,833,556, which is a continuation-in-part of U.S. patent application Ser. No. 10/217,758, filed Aug. 12, 2002, now U.S. Pat. No. 7,084,423, all of which are assigned to the same assignee as the present application.

FIELD OF THE INVENTION

The invention relates generally to solid-state switching and amplification devices. More particularly, the invention relates to a transistor having passivated metal-semiconductor junctions from the source to the channel and/or from the channel to the drain and at which the Fermi level of a semiconductor which comprises the channel is depinned.

BACKGROUND

One of the most basic electrical junctions used in modem devices is the metal-semiconductor junction. In these junctions, a metal (such as aluminum) is brought into contact with a semiconductor (such as silicon). This forms a device (a diode) which can be inherently rectifying; that is, the junction will tend to conduct current in one direction more favorably than in the other direction. In other cases, depending on the materials used, the junction may be ohmic in nature (i.e., the contact may have negligible resistance regardless of the direction of current flow). In addition to diodes, such metal-semiconductor junctions are also present at source/drain-channel interfaces within a class of transistors known as MOSFETs (metal oxide semiconductor field effect transistors).

As explained in the above-cited patent application, there exists at a metal-semiconductor contact a so-called Schottky barrier. The Schottky barrier at a conventional metal-semiconductor junction is characterized by Fermi level pinning of the semiconductor, due to both extrinsic and intrinsic surface states. The extrinsic states may arise from defects in the crystal structure of the interface. The intrinsic states arise from the quantum-mechanical penetration of the electrons in the metal into the bandgap of the semiconductor. These so-called metal-induced gap states (MIGS) appear to be of fundamental importance in explaining the physics of such junctions. See J. Tersoff, "Schottky Barrier Heights and the Continuum of Gap States," Phys. Rev. Lett. 52 (6), Feb. 6, 1984.

The Schottky barrier height at a metal-semiconductor interface determines the electrical properties of the junction. Thus, if it were possible to control or adjust the barrier height of a metal-semiconductor junction, electrical devices of desired characteristics could be produced. To tune the barrier height, the Fermi level of the semiconductor must be depinned. As discussed in detail in the above-cited patent application, the present inventors have achieved this goal in a device that still permits substantial current flow between the metal and the semiconductor. Below, the inventors present an application of this technology to MOSFET devices.

MOSFETs which incorporate Schottky junctions have a long- and largely unfruitful-history. In 1966, Lepselter and Kahng were investigating Schottky diodes. In that year they received U.S. Pat. No. 3,290,127 directed to a device with a PtSi/Si interface. Use of the silicide was found to be an improvement over previous metal/Si contacts. The diodes were reproducible and stable, in part because the interface was sealed, as noted by the inventors at the time. The silicide also may reduce the extrinsic surface states (defects). The remaining pinning is most likely due to intrinsic surface states (MIGS), although this was not recognized at the time. Shortly thereafter, Lepselter and Sze incorporated the Schottky barrier into a MOSFET (see M. P. Lepselter and S. M. Sze, "SB-IGFET: An insulated-gate field-effect transistor using Schottky barrier contacts as source and drain", Proc. IEEE 56, 1088 (1968)). U.S. Pat. No. 3,590,471 to Lepselter discussed the incorporation of the Schottky barriers, but the channel was still essentially isolated by implanted regions. The first patent for a channel isolated by Schottky barriers (U.S. Pat. No. 3,708,360) was issued to Wakefield and Cunningham in 1973. This device also utilized silicide junctions.

In U.S. Pat. No. 4,300,152, Lepselter described a Schottky barrier MOSFET. By eliminating the pn-junction in the source-substrate region, Lepselter showed that the parasitic pnpn structure responsible for latch-up could be eliminated. The proposed devices still utilized PtSi for the source and drain metal, however.

An extension of Lepselter's early work is found in U.S. Pat. No. 4,485,550 to Koeneke et al. In these devices, an extra implant is added to extend beyond the source metal. This is similar to modem CMOS halo implants. The extra implant improves the drive current capabilities of the transistor by bringing the channel edge under the gate. The channel isolation in this device is from a pn-junction, not the PtSi source metal. An attempt to bring the source under the gate was investigated by recessing the source/drain contacts by etching (see C. J. Koeneke et al., "Schottky MOSFET for VLSI", IEDM, 367 (1981)). Sidewall spacers were still a limiting factor, however. This was improved by Snyder as described in U.S. Pat. No. 6,303,479, which also disclosed the ability to control vertical doping profiles without regard to horizontal profile control. The contacts were again made from PtSi.

U.S. Pat. No. 6,096,590 to Chan et al. describes a device in which the PtSi/Si junctions are not recessed. This yields a poor sub-threshold slope from reduced coupling of the gate at the edge of the channel. Exponential turn-on, indicative of the Schottky barrier being too high, is seen in measurements presented in the patent. Further, the gate-source capacitance will be high.

Recently, MOSFET devices having metal-semiconductor junctions between a source/drain and a channel have been demonstrated with sub-50 nm channel-lengths, using PtSi2 (see, e.g., C. Wang et al., "Sub-40 nm PtSi Schottky source/drain metal-oxide field-effect transistors", Appl. Phys. Lett. 74, 1174 (1999); and A. Itoh et al., "A 25-nm-long channel metal-gate p-type Schottky source/drain metal-oxide-semiconductor field-effect transistor on separation-by-implanted-oxygen substrate", J. Journal Appl. Phys. Part 1 39, 4757

(2000)), ErSi2, (see, e.g., J. Kedzierski et al., "Complementary silicide source/drain thin-body MOSFETs for the 20 nm gate length regime", IEDM Tech. Dig., International Electron Devices Meeting 2000, San Francisco, Calif., p. 00-57 (2000); and W. Saitoh et al., "Analysis of short-channel Schottky source/drain metal-oxide-semiconductor field-effect transistor on silicon-on-insulator substrate and demonstration of sub-50-nm n-type devices with metal gate", J. Journal Appl. Phys. Part 1 38, 6226 (1999)), and CoSi2 (see, e.g., U. K. Matsuzawa et al., "Enhancement of hot-electron generation rate in Schottky source metal-oxide-semiconductor field-effect transistors", Appl. Phys. Lett. 76, 3992 (2000)) for the source/drain metal. Also, simulations have been performed all the way down to channel lengths of 10 nm (see, e.g., C. K. Huang et al., "Two-dimensional numerical simulation of Schottky barrier MOSFET with channel length to 10 nm", IEEE Trans. on Elect. Dev. 45, 842 (1998)), although a poor choice of device parameters limited the performance results, e.g., a large <DB. The performance of all of these devices is limited in part by the inability to control, and especially to lower, the height of the Shottkky barrier at the source and drain interfaces to the channel.

Only two disclosures of a non-silicide pure-metal/Si contact embodiment of a Schottky-barrier MOSFET have been found by the present inventors. Welch, U.S. Pat. No. 5,663,584, seems to describe Schottky barrier MOSFET systems and fabrication thereof; however, a contact of "metal or metal silicide" is mentioned. This is inappropriate for fabrication of a device with a controlled barrier height. That is, there is no surface treatment or interface dielectric disclosed.

The disclosure by Hebiguchi in U.S. Pat. No. 5,801,398 is perhaps more practical, and a method for manufacturing a thin-film transistor such as for use in displays is presented. In this device (which is a field effect transistor or FET), the source/drain contacts to the Si channel are metal (a list of possibilities is presented), but again, no surface preparation is mentioned.

FIG. 1 shows the FET 100 that was discussed by Hebiguchi. The transistor contains a glass substrate 110, a gate electrode 120, a gate insulating film 130, a drain electrode 140, a source electrode 150, and a semiconductor active film 160. During operation, voltage is applied to the source electrode 150 and to the gate electrode 120. The voltage applied to the gate electrode 120 changes the electrical properties of the semiconductor active film 160 allowing current to flow from the source electrode 150 to the drain electrode 140. In particular, the voltage applied to the gate electrode 120 creates a channel-generating region 170, in the semiconductor active film 160 a short distance from the gate insulating film 130, through which current may flow.

Hebiguchi describes the semiconductor active film 160 as being hydrogenated amorphous silicon, the drain and source electrodes 140 and 150 are formed of conductive materials (metals) such as chromium (Cr), aluminum (Al), tantalum (Ta), platinum (Pt), gold (Au), tungsten (W), nickel (Ni), molybdenum (Mo), or certain mixtures of these materials, and the junctions between the semiconductor active film 160 and the source and drain electrodes 150 and 140 are insulating Schottky barriers. The metal selected for an n-channel thin film transistor is chosen on the basis of having a workfunction that is smaller than that of silicon and the metal selected for a p-channel thin film transistor has a workfunction that is larger than that of silicon.

A significant limitation with the transistor discussed in Hebiguchi, is the generally poor control over the Schottky barrier height. As is well known, use of different metals with widely varying work functions tends to result in Schottky barriers which vary in height over a dramatically reduced range. Further, no special effort is made in Hebiguchi to control or reduce extrinsic surface states.

Another type of junction to the channel is introduced by Yoshimura in U.S. Pat. No. 6,037,605, with the stated goal being to reduce short-channel effects. An oxide or nitride is disposed between Si source and drain contacts and a Si channel. The oxide is thicker farther away from the channel (down into the Si) to reduce currents not controlled by the gate. The thickness of the oxide is "sufficiently thin to permit charge tunneling", and is disclosed to be 0.5 to 2.0 nm. This differs from the present invention, which is described in detail below, in several ways, for example the use of Si as a source/drain, as opposed to a metal.

SUMMARY OF THE INVENTION

A transistor includes a semiconductor channel disposed nearby agate (e.g., separated therefrom by a dielectric) and disposed in an electrical path between a source and a drain, wherein the channel and at least one of the source or the drain are separated by an interface layer so as to form a channel-interface layer-source/drain junction in which a Fermi level of the semiconductor channel is depinned in a region near the junction and the junction has a specific contact resistance of less than approximately 1000 $\Omega$-$\mu m^2$. The interface layer may include a passivating material such as a nitride, a fluoride, an oxide, an oxynitride, a hydride and/or an arsenide of the semiconductor of the channel. In some cases, the interface layer consists essentially of a monolayer configured to depin the Fermi level of the semiconductor of the channel, or an amount of passivation material sufficient to terminate all or a sufficient number of dangling bonds of the semiconductor channel to achieve chemical stability of the surface. Also, the interface layer may include a separation layer of a material different than the passivating material. Where used, the separation layer has a thickness sufficient to reduce the effects of intrinsic surface states in the semiconductor channel.

BRIEF DESCRIPTION OF THE DRAWINGS

The present invention is illustrated by way of example, and not limitation, in the figures of the accompanying drawings, in which like reference numerals refer to similar elements.

DETAILED DESCRIPTION OF THE INVENTION

The above-cited co-pending patent application describes processes for depinning the Fermi level of a silicon-based or germanium semiconductor (e.g., Si, SiC, SiGe, SiGeC, or Ge) at a metal-semiconductor junction as well as devices that use such a junction. As more fully discussed in that application, an interface layer is introduced between the semiconductor and the metal. The interface layer functions to passivate the semiconductor surface (that is, terminate dangling bonds that may otherwise be present at the semiconductor surface so as to assure chemical stability of the surface) and to displace the semiconductor from the metal so as to reduce the effect of MIGS.

As discussed more fully below, the present inventors have determined that for thin interface layers disposed between a metal and a silicon-based or germanium semiconductor (e.g., Si, SiC, SiGe, SiGeC, or Ge), so as to form a metal-interface layer-semiconductor junction, there exist corresponding minimum specific contact resistances. Indeed, minimum specific contact resistances of less than or equal to approximately 1000 $\Omega$-$\mu m^2$ less than or equal to approximately 100 $\Omega$-$\mu m^2$ or less than or equal to approximately 50 $\Omega$-$\mu m^2$ or less than or equal to approximately 10 $\Omega$-$\mu m^2$ or even less than or equal to approximately 1 $\Omega$-$\mu m^2$ may be achieved for such junctions in accordance with the present invention. To achieve such low contact resistances, a metal that has a work function near the conduction band of the semiconductor for n-type semiconductors, or a work function that is near the valence band for p-type semiconductors, is selected.

Figure 8:
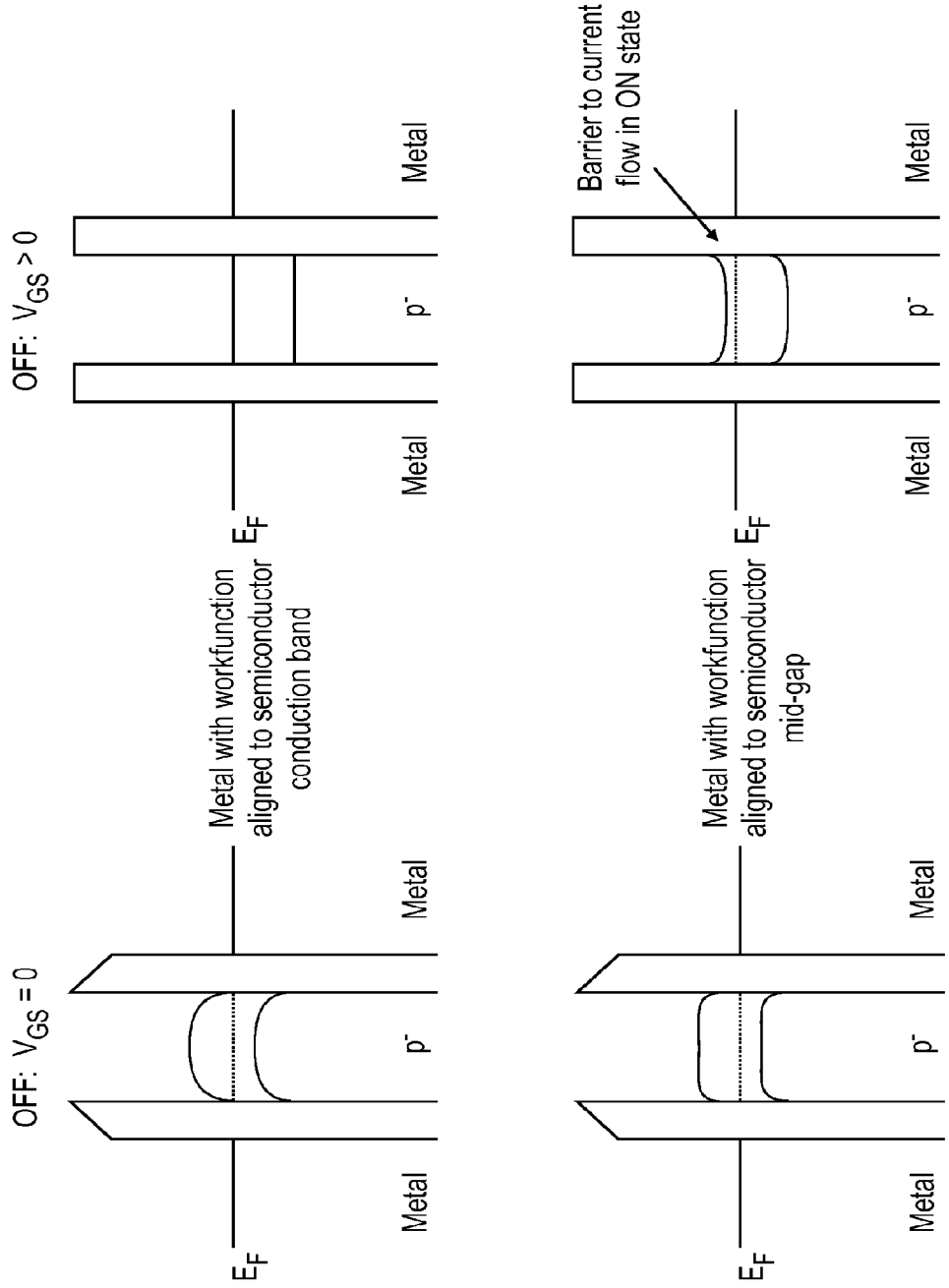
FIG. 8 illustrates the operation of different n-type devices having tunnel barriers in accordance with an embodiment of the present invention under various gate voltage conditions.

The effect of (and reason for) using such metals may be understood with reference to FIG. 8. Shown in the illustration is a 2×2 grid of band diagrams. The upper two diagrams illustrate the operation of an n-type device having tunnel barriers (in the form of an interface layer configured in accordance with the present invention) and a metal source/drain in which the workfunction is aligned to the semiconductor channel conduction band under different gate voltages. Notice that the device is OFF (i.e., not conducting current) when the gate-to-source voltage (VGS) is 0. The device is ON (i.e., conducting current) when VGS>O. The lower two diagrams illustrate the operation of the n-type device having a metal source/drain in which the workfunction is aligned to the semiconductor channel mid-gap. Notice that even in the ON state ON (i.e., VGS>O) a barrier to current flow exists due to band bending. This results in a higher contact resistance.

The interface layers described in the above-cited patent application may be used in connection with a semiconductor surface of a channel in a FET, as discussed below. That is, an interface layer may be disposed between a source and a channel, a channel and a drain, or both of an insulated gate field effect transistor. Such use of an interface layer is described in detail herein. The present invention provides a source-channel and/or channel-drain contact wherein the Fermi level of the source and/or drain metal is aligned (or approximately aligned) with the conduction or valence band of the semiconductor, depending on the type of semiconductor material and metals used.

In addition, the junction of the present invention can be used in making contacts to source or drain implanted wells and will have the advantage of reducing the need for high doping levels (which are now reaching their limits of solid solubility). The high doping profiles were required in the past in order to keep the junction depletion layer relatively thin, so as to increase the tunneling current, thus reducing the junction resistance. However, it is becoming increasingly difficult to increase doping profiles in order to provide low resistance junctions. It may be possible to reach the same level of resistance with a lower doping concentration using the present invention. It may further be possible to achieve much lower resistance even with lower doping concentration. When the present invention is used with high doping levels, the resistance will be further reduced.

To aid in the understanding of the present invention, the following description provides specific details of presently preferred embodiments of the invention. It will be apparent, however, to one skilled in the art that the present invention may be practiced without some of these specific details, for example by substituting well-known equivalent materials in place of those described herein for semiconductors, passivation layers and/or conductors. Where the discussion refers to well-known structures and devices, block diagrams are used, in part to demonstrate the broad applicability of the present invention to a wide range of such structures and devices.

The present inventors have devised a scheme to passivate a semiconductor surface such as a channel surface within a Schottky barrier transistor. The scheme involves forming a passivation layer which is a nitride, hydride, oxide, arsenide and/or fluoride of the semiconductor that makes up the channel. In some cases (e.g., when the passivating layer is a hydride or fluoride of the semiconductor of the channel), it may be necessary to include a separation layer between the semiconductor and the metal source/drain to reduce or eliminate the effect of intrinsic surface states in the semiconductor channel. The term interface layer will be used in connection with the present invention to include passivation layers alone and passivation layers in combination with separation layers, where such separation layers are appropriate.

The interface layer chemically neutralizes and physically protects the semiconductor channel surface. The interface layer also allows for a tunable Schottky barrier, having a height that depends on bulk characteristics of the channel semiconductor and the source/drain metal, rather than on surface properties. This allows greater control over the barrier height to meet the operational characteristics that are desired for the transistor. This scheme differs from past attempts by others to insulate channel surfaces and provide adjustable Schottky barriers in that the passivation materials used for the interface layer are not limited to metals that readily form silicides with the semiconductor channel. In other words, the present invention decouples the need for semiconductor passivation from other considerations used to select the source/drain metal, such as the desirability of a particular workfunction. It further provides for greater control of the Schottky-barrier height than previously possible.

I. An Exemplary Transistor

Figure 1:
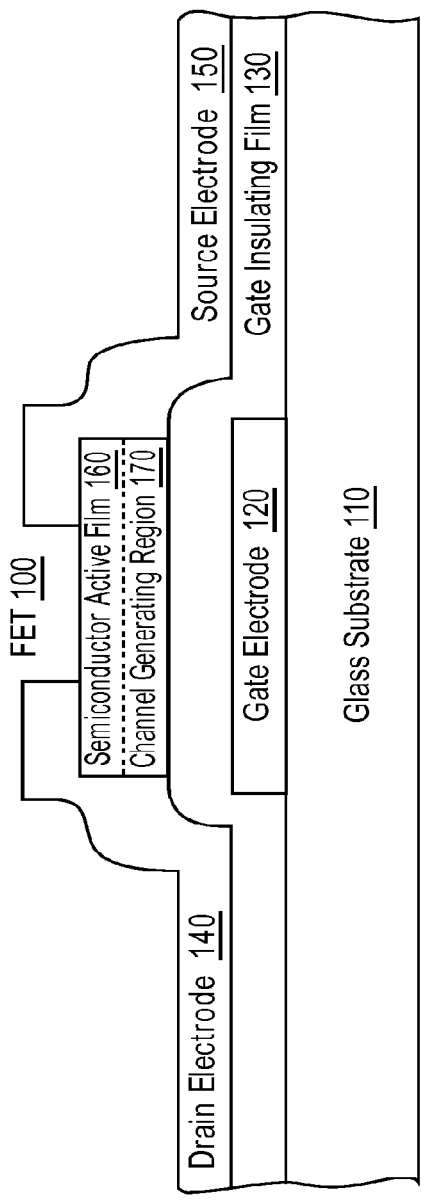
FIG. 1 shows a conventional FET having metal-semiconductor Schottky junctions between the source and the channel and the channel and the drain.
Figure 2:
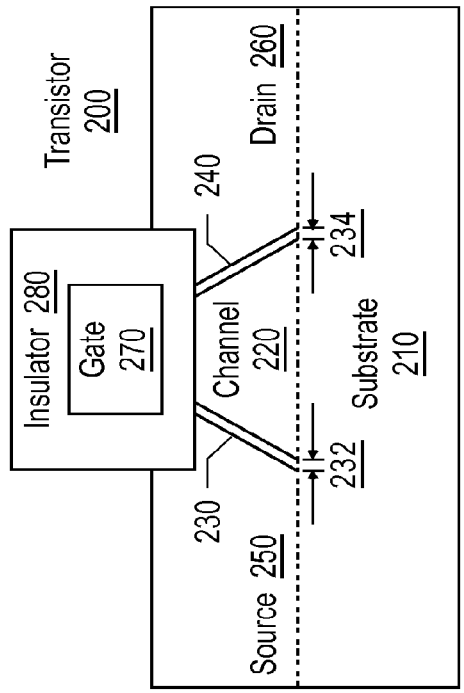
FIG. 2 shows a FET having passivated metal-semiconductor junctions from the source to the channel and from the channel to the drain, according to one embodiment of the present invention.

FIG. 2 shows a transistor 200 formed on a substrate 210 (e.g., a semiconductor substrate such as Si or a compound substrate such as SOI) and configured in accordance with an embodiment of the present invention. The transistor 200 contains a channel 220 that is separated from a source 250 and a drain 260 by interface layers 230 and 240, respectively, each of which form passivated Schottky barriers. The particular transistor 200 shown, which is one example of a switching device, is an Insulated Gate FET. The interface layers 230 and 240 passivate the surfaces of channel 220 in the regions of the source/drain-channel junctions by chemically stabilizing the channel surface. The interface layers 230 and 240 also reduce or eliminate the effect of MIGS in the region of the source/drain-channel junctions by displacing the source/drain (250/260) away from the channel 220. The result of introducing the interface layers 230 and 240 between the semiconductor channel 220 and the metal source/drain 250/260 is a depinning of the Fermi level of the semiconductor that makes up channel 220. When the Fermi level of the semiconductor is depinned, the height of the Schottky barrier will depend only on the difference of the bulk workfunctions of the metal and the semiconductor in contact at the junction, and will not be dependent upon the interface. The reduction in the effectiveness of the MIGS to pin the Fermi level depends on the choice of interface dielectric. There will be MIGS at the interface between the metal and the dielectric. In general, dielectrics have much weaker MIGS than semiconductors, primarily due to larger bandgaps. Thus the choice of dielectric is important in determining the final electrical characteristics of the Schottky barrier junction.

The transistor 200 also includes a gate 270 surrounded by an insulator 280. The terms gate, source and drain each refer to terminals of a three terminal Insulated Gate FET. The source 250 and drain 260 are the terminals between which conduction occurs under the influence of an electric field resulting from a voltage applied to the gate 270. The source 250 and the drain 260 are provided at opposite ends of the channel 220 so that the channel 220 is disposed between the source 250 and the drain 260. Often, though it is not a requirement of the present invention, the source 250 and drain 260 are fabricated such that they are geometrically symmetrical. Symmetrical source and drain terminals may be referred to as source/drain terminals. A particular terminal may be designated a source or a drain on the basis of the voltage to be applied to that terminal when the FET is operated in an electrical circuit. In the particular transistor 200 shown, the source 250 is provided at a left-hand side of the channel 220 and the drain 260 is provided at a right-hand side of the channel 220, although another embodiment is contemplated wherein the source 250 and the drain 260 are interchanged.

The source 250 and the drain 250 may each contain a conductor, preferably a metal. Examples of metals that may be used include pure metals, alloys, refractory metals, metals that do not form silicides, and metals having a predetermined work function. The gate 270, which may also preferably contain a conductor, such as a metal, is located above the channel 220 and is capacitively coupled to the channel 220 through the insulator 280. Note, in other embodiments the transistor's three terminals may be co-planar or the gate 270 may be disposed below the level of the source 250 and/or the drain 260 in the substrate 210.

The insulator 280 (which may be made of a dielectric such as an oxide of the metal gate or an oxide of a semiconductor) surrounds the gate 270 and separates the gate 270 from the source 250, the drain 260, the channel 220, and the interface layers 230 and 240. The insulator 280 is of a sufficient thickness to provide a high resistance between the gate 270 and the channel 220 such that essentially no current flows between the gate 270 and the channel 220. For example, the resistance may be between about 108 Ohms and about 1012 Ohms, or greater. Such a resistance may allow the gate 270 and the channel 220 to be capacitively coupled, while preventing current from flowing between the gate 270 and the channel 220.

The insulator 280 may also or alternatively contain a high-k dielectric material that has a higher dielectric constant than that of silicon dioxide (i.e., higher than about 4.0). The high-k material may allow the same charge induced in the channel 220 under the gate 270 to be achieved at the same gate voltage in a thicker layer. That is, the higher dielectric constant may allow the insulator 280 to have a greater layer thickness than a corresponding layer of silicon dioxide that provides the same amount of insulation. The increased thickness may simplify fabrication of the transistor 200. The thicker layer may also have less leakage current than a thinner Si02 layer. Exemplary high-k dielectric materials that are contemplated include materials having a dielectric constant greater than about 4 (e.g., zinc oxide, ZnO), greater than about 10 (e.g., aluminum oxide, Al2O3), greater than about 20 (e.g., zirconium oxide, ZrO2), and greater than about 40 (e.g., hafnium oxide, HfO).

As discussed above, the channel 220 contains a semiconductor material. The term semiconductor is used to refer to a material having a bandgap that is greater than about 0.1 electron volts and less than about 4 electron volts. Exemplary semiconductors that are contemplated include Si, Ge, SiGe or SiC. The semiconductor material may have a wide range of doping levels including no doping at all. The interface layers 230 and 240 each contain a passivation material that provides passivation to the channel 220 by covalently bonding with a dangling bond of a surface semiconductor atom to fully coordinate the semiconductor atom and thereby help passivate the semiconductor atom. The passivation material is preferably selected from the group consisting of a hydride, a nitride, an arsenide, an oxide and a fluoride of the semiconductor channel 220. Depending on the passivation material selected (e.g., where H, As or F are used as passivation materials), a separation layer in addition to a passivation layer within the interface layers 230 and 240 may be needed. Of course, the combination of the passivation layer and the separation layer must be sufficiently thin to permit the low specific contact resistances described in the above-cited patent application. Further details regarding the formation of an interface layer may be found in the above-cited patent application and will not be repeated herein.

II. Fabricating a Transistor Having Passivated Schottky Barriers to the Channel

Figure 3:
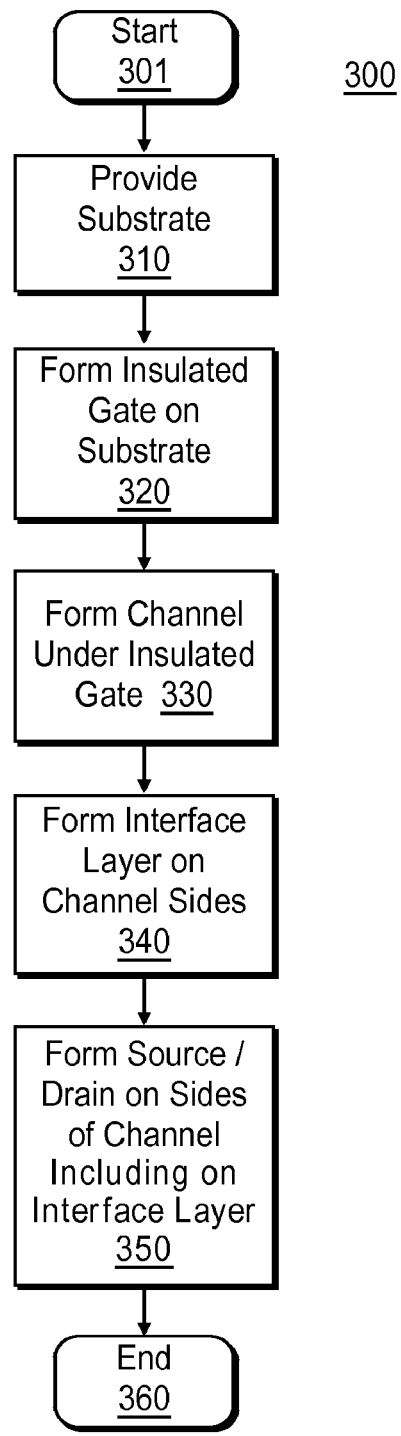
FIG. 3 shows a method for fabricating a transistor having passivated metal-semiconductor junctions from the source to the channel and from the channel to the drain, according to one embodiment of the present invention.

FIG. 3 shows a method 300 for fabricating a transistor having passivated metal-semiconductor junctions from the source to the channel and from the channel to the drain, according to one embodiment of the present invention. The method starts at block 301 and then proceeds to block 310 where a substrate is provided. At block 320 an insulated gate structure is formed on the substrate. The insulated gate structure may contain a gate having a conductive material (e.g., a metal) and a gate insulator having an insulating material beneath the conductive material. Then at block 330 a channel is formed under the insulated gate. The channel may include undercut void regions subjacent the gate dielectric and extending into the channel on both ends of the insulated gate structure. The method advances to block 340 where an interface layer is formed on the channel sides. Forming the interface layer may include creating a passivating layer and (where necessary) a separation layer using one or more of the materials discussed above. The method then advances to block 350 where a source and drain are formed on opposite sides of the channel, including on the interface layer, and within any undercut regions. Depending upon the interface layer thickness and robustness, the source and drain may be formed by substantially non-invasive approaches. The method terminates at block 360.

An alternative procedure does not use the undercut described above. Instead, there is an "underlap". That is, in the alternative process the width of the gate is intentionally made less than the width of the channel so that the gate underlaps the channel.

III. Exemplary Process for Fabricating a Transistor

Figure 4A:
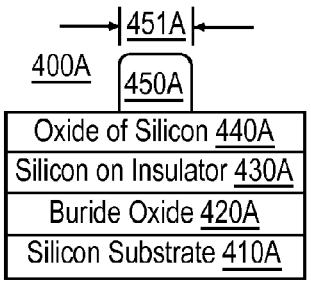
FIGS. 4A-4I show intermediate substrates representing fabrication of a transistor having passivated aluminum-silicon junctions formed from an aluminum source to a silicon channel and from the silicon channel to an aluminum drain, according to one embodiment of the present invention.
Figure 4B:
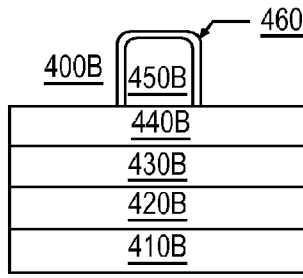
Figure 4C:
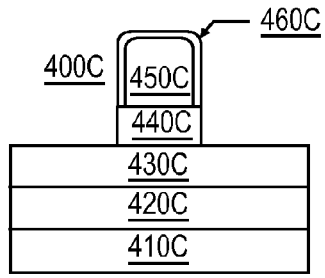
Figure 4D:
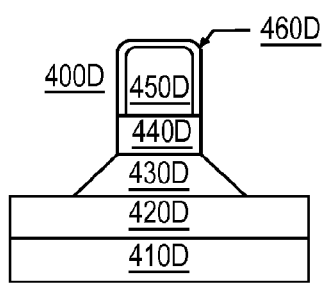
Figure 4E:
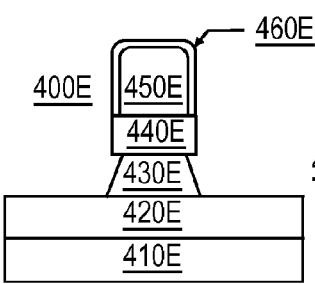
Figure 4F:
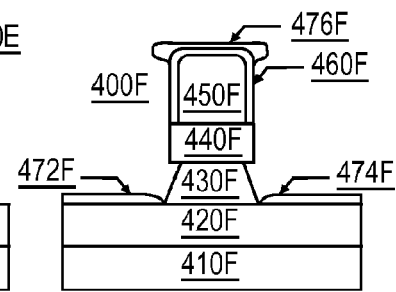
Figure 4H:
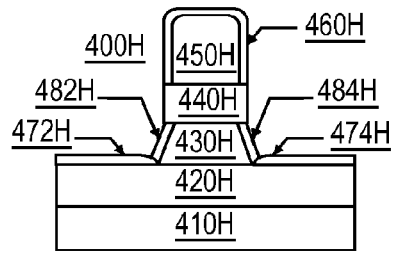
Figure 4G:
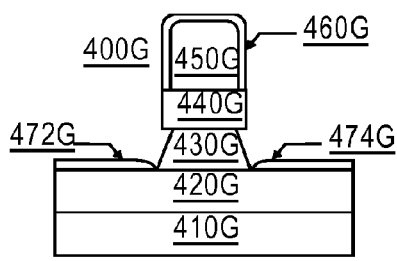
Figure 4I:
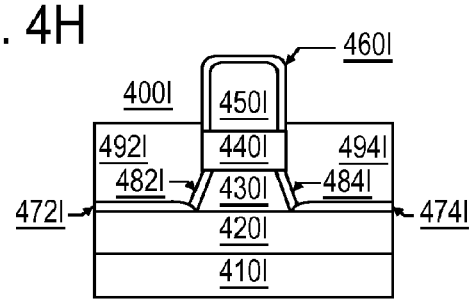

FIGS. 4A-I show intermediate substrates, representing fabrication of the transistor shown in FIG. 4I, according to one embodiment of the present invention. The particular transistor shown in FIG. 4I contains passivated aluminum-silicon junctions 482I and 484I formed from the aluminum source 492I to the silicon channel 430I and from the silicon channel 430I to the aluminum drain 494I. However, this is merely one example of a transistor configured in accordance with the present invention. For example, planar devices, wherein the gate, source and drain are co-planar in or above the substrate are also within the scope of the present invention, as are embodiments where the gate is disposed in a plane below the source and/or drain. Likewise, embodiments wherein the width of the gate is less than the width of the channel are included within the present invention.

FIGS. 4A-I therefore show one embodiment of fabricating a transistor, according to the method 300. FIGS. 4A-4C show providing a substrate and forming an insulated gate on the substrate. FIGS. 4D-4E show forming a channel beneath the insulated gate, such that the channel and the insulated gate define a first and a second undercut void region that extend underneath the insulated gate toward the channel from a first and a second side of the insulated gate. FIG. 4G shows forming an interface layer on exposed sidewall surfaces of the channel. Finally, FIGS. 4F, 4G, and 4H show forming a source and a drain terminal on a first and a second side of the channel including on the interface layers, and forming extension tips within the undercut voids beneath the insulated gate.

FIG. 4A shows a first intermediate substrate 400A containing a silicon substrate 410A, a layer of buried oxide of silicon 420A, a layer of silicon on insulator 430A, a layer of an oxide of silicon 440A, and an aluminum gate 450A. The layers 410A-430A represent a conventional Silicon On Insulator (SOI) substrate. The SOI substrate includes the buried layer 440A to help isolate proximate semiconductor devices formed in the layer of silicon on insulator. This isolation may help reduce short-channel effects, as compared to semiconductor devices formed in a bulk wafer. The buried oxide layer may have a thickness that is effective to isolate the silicon on insulator, preferably greater than about 10 nm. The layer of silicon on insulator may have a thickness of about 20 nm, or slightly less.

As will be understood by a person having an ordinary level of skill in the art and the benefit of the present disclosure, the SOI substrate is not a limitation of the present invention. Other substrates are contemplated to replace the SOI substrate. For example, the SOI substrate may be replaced by a Silicon-On-Sapphire substrate, although this may increase the cost of fabrication, or the SOI substrate may be replaced by a plain silicon wafer, although this may provide inferior electrical isolation of semiconductor devices and poor short-channel characteristics.

The layer of oxide of silicon 440A, in one embodiment silicon dioxide ($SiO_2$), may be formed by wet or dry oxidation of the silicon on insulator, as is common in the semiconductor processing arts. The layer may be sufficiently thin to serve as a gate oxide and have a thickness between about 1 nm and about 10 nm.

The aluminum gate 450A is formed on the oxide 440A. The aluminum gate has a width 451A that is about equal to, or slightly larger than the intended channel length, which in one embodiment is less than about 50 nm and in another embodiment is less than about 20 nm. More than slight increases of the width over the channel length may increase the extent and angle of a subsequent undercut etch, which may complicate fabrication. The gate 450A may be formed by depositing a layer of aluminum on the oxide 440A, depositing a photoresist layer on the deposited aluminum layer, exposing a pattern including the width 451A in the photoresist using conventional high-resolution lithography, removing a portion of the photoresist according to the exposed pattern, wet or dry etching a portion of the deposited layer of aluminum according to the patterned photoresist, and removing the remaining photoresist.

FIG. 4B shows a second intermediate substrate 400B containing an oxide of aluminum insulator 460B formed on exposed portions, including the top and sides, of the aluminum gate 450B. The oxide of aluminum layer 460B may have a thickness between about 1 nm and about 20 nm. The thickness may be about equivalent to the thickness of the layer 440B, or slightly larger. Larger thickness may improve performance by reducing capacitance between the gate and the source, however the additional thickness may also increase fabrication complexity by increasing undercut. Forming the oxide of aluminum layer 460B may include oxidizing the aluminum gate 450A in an oxygen plasma etcher that provides a suitable oxidizing atmosphere, or by other methods known in the semiconductor processing arts.

FIG. 4C shows a third intermediate substrate 400C containing a gate oxide 440C formed by removing a portion of the layer 440B that is not beneath aluminum gate 450B or aluminum oxide 460B. The removal may include using the oxidized aluminum gate 450B-460B as a mask for the layer 440B and etching portions of the layer 440B that are not subjacent to and concealed by the oxidized aluminum gate 450B-460B. This removal leaves a portion of the silicon on insulator layer 430C that is not subjacent to the gate oxide 440C, aluminum gate 450C, or oxide 460C exposed. Etching may include Reactive Ion Etching (RIE) to encourage etching preferentially in the direction normal or perpendicular to the surface of the layer 440B. RIE is a dry-etch process wherein the intermediate substrate 400B is placed on a radio frequency powered electrode and provided with a potential that helps ionize and accelerate ion bombardment of etching species extracted from plasma toward the etched surface.

FIG. 4D shows a fourth intermediate substrate 400D containing a silicon channel 430D formed by removing a portion of the silicon on insulator layer 430C that is substantially not subjacent and concealed by the gate oxide 440C. Removal may include etching silicon on insulator that has a standard Si-100 orientation with tetrmmethylammonium hydroxide (TMAH) to form angled sidewalls that slope inward toward the gate 450D, as shown. Alternatively, comparatively straight sidewalls aligned with the gate oxide 440D may be formed by a self-limiting etch in TMAH if the silicon on insulator has a Si-110 orientation. Such comparatively straight sidewalls may also be formed by RIE.

FIG. 4E shows a fifth intermediate substrate 400E containing an undercut silicon channel 430E formed by removing a portion of the channel 430D that is subjacent and aligned with the gate oxide 440D. The undercut silicon channel 430E contains an undercut region wherein the silicon is removed from the channel 430D at a left and right-hand edge of the gate oxide 440D to allow a subsequent formation of source and drain material vertically under the gate oxide 440E. Removal may be by a nondirectional or isotropic wet silicon etch with TMAH wherein etching takes place in substantial uniform amounts along the sidewall. If the crystal axis of the silicon on insulator are not aligned precisely with the lithography, the TMAH etch May not be completely self-limiting and may form an undercut due to the vertical ridges or stair steps of crystal structure. Alternatively, removal may be by an isotropic RIE.

FIG. 4F shows a sixth intermediate substrate 400F containing a seed layer 476F, 472F, and 474F formed respectively on a top surface of the insulated gate and on a left and right-hand side of the insulated gate. The seed layer facilitates subsequent formation of a metal source and drain. The seed layer may be deposited anisotropic ally so that no significant seed layer material is deposited on the vertical sidewalls of the aluminum oxide 460F, gate oxide 440F, or channel 430F and essentially no metal is deposited on the underside of the undercut overhang of the gate oxide 440F. This is desired to electrically isolate the seed layer portion 476F from the seed layer portion 472F and 474F. In one embodiment, the seed layer contains chromium deposited from a thermal source. Chromium provides desirable electrochemistry and is well suited for formation of ultra-thin films.

FIG. 4C shows a seventh intermediate substrate 400G containing a modified seed layer 472G-474G formed by selectively removing the layer portion 476F from the top surface of the insulated gate. Removal of the portion 476F is desirable to allow depositing the source and drain materials superjacent the layer portions 472G and 476G without depositing the source and drain materials atop the oxidized aluminum gate structure. Since the seed layer portion 476F is electrically isolated from the seed layer portions 472F and 476F, the portion 476F may be removed electrochemically by a Cerric Ammonium Nitrate (CAN) chrome etch. For example, the seed layer portions 472F and 474F but not the seed layer portion 476F may be electrically coupled with a copper electrical probe at the edge of the substrate to etch the seed layer portion 476F but not the portions 472F-474F. It should be noted however, that another embodiment is contemplated wherein patterning may be used to form chromium layers 472F and 474F without forming chromium layer 476F. This may avoid a subsequent removal of the chromium layer 476F.

FIG. 4H shows an eighth intermediate substrate 400H containing interface layers 482H and 484H formed on the sidewall surfaces of the channel 430H. The interface layers may be a monolayer, slightly more than a monolayer, less than about 0.3 nm, less than about 0.5 nm or less than about 1 nm (depending upon the desired Schottky barrier characteristics). That is, in some cases an amount of passivation material sufficient to terminate all or a sufficient number of dangling bonds of the semiconductor channel to achieve chemical stability of the surface may be used. The interface layers may be grown in accordance with the techniques discussed in the above-cited patent application. Passivation materials that are contemplated include arsenic, hydrogen, fluorine, oxygen, and nitrogen, as discussed above, and the interface layers 482H and 484H may be made up of both a passivation layer and a separation layer.

FIG. 4I shows a ninth intermediate substrate 400I containing a source 492I formed superjacent upon the seed material 472H and beneath the left undercut overhang and a drain 494I formed superjacent upon the seed material 474H and beneath the right undercut overhang. The source and drain have a thickness that extends above the gate insulator 440I. Desirably, the thickness may be precisely controlled. Forming may include plating the potentially different source/drain materials on the seed layers 472H and 474H. This may include depositing a photoresist, irradiating the photoresist to expose a channel width pattern, removing a portion of the photoresist to expose the seed layers 472H and 474H, plating the source/drain materials on the seed layers 472H and 474H, and removing the remainder of the photoresist. According to one embodiment, the source and drain materials are aluminum. Alternatively, the source and drain materials may be another desired and potentially different metal or alloy.

The transistor shown in FIG. 4I has a number of advantages. In general, the transistor provides a simple construction. This may allow extending transistor fabrication below 50 nm channel lengths, below 20 nm channel lengths, or even below 10 nm channel lengths. Another advantage is greater control over the Schottky barrier height provided by the interface layers. The barrier height may be controlled by the properties of the interface layer such as passivation material, layer thickness, and layer formation conditions, in addition to difference in work functions between the source/drain and the channel. This ability to control the barrier height is further increased by greater flexibility in selecting source/drain materials, since, due to the interface layers, the source/drain materials do not have to readily form silicides with the silicon channel. Yet another advantage is low resistance in the source due to the use of a high conductivity metal rather than doped silicon. Removal of dopants in the junctions in general may be attractive from an Ultra-Large-Scale-Integration (ULSI) manufacturing perspective, since application of such dopants is posing a limit to process controllability.

The channel-interface layer-source/drain junction(s) of the transistor shown in FIG. 4I are unique in that the Fermi level of the semiconductor channel is depinned in a region near the junction and the junction has a specific contact resistance of less than approximately 1000 $\Omega$-$\mu m^2$. This is true of all transistors configured in accordance with the present invention. Indeed, minimum specific contact resistances of less than or equal to approximately 10 $\Omega$-$\mu m^2$ or even less than or equal to approximately 1 $\Omega$-$\mu m^2$ may be achieved for such junctions in accordance with the present invention. To achieve such low contact resistances, a source/drain metal that has a work function near the conduction band of the semiconductor for n-type semiconductors, or a work function that is near the valence band for p-type semiconductors, is selected. The depinning role played by the interface layer in tuning, adjusting, or controlling the height of the barrier between the source/drain and the semiconductor channel involves both a reduction in surface states of the channel, by bonding to the semiconductor material to consume dangling bonds, a reduction in the formation of MIGS in the semiconductor channel, by providing a thickness and bandgap that prevent the electron wave function (of the source/drain metal) from penetrating into the semiconductor channel. The electron wave function may instead penetrate into the interface layer and form MIGS within the interface layer at an energy related to the states of the interface layer material. As desired, the density of the MIGS and the depth of MIGS penetration into the interface layer may be reduced by choosing an interface layer material or materials having a larger bandgap or higher effective mass than the semiconductor of the channel. The interface layer is operable to pass current to/from the semiconductor channel during device operation.

In some embodiments, it may be desirable to use an interface layer having a thickness of a monolayer, or, for example between about 0.1 nm and about 0.3 nm, and also having a wide bandgap (as compared to that of the semiconductor of the channel) so that the interface layer both depins the Fermi level (so that the barrier height depends predominantly on bulk properties of the junction materials) and allows sufficient current transfer across it. In some cases the interface layer may include only an amount of passivation material sufficient to terminate all or a sufficient number of dangling bonds of the semiconductor channel to achieve chemical stability of the surface. Advantageously, such interface layers may be sufficiently thin to provide low impedance to current flow (due to the exponential dependence of direct tunneling on barrier thickness), which is desirable for many semiconductor devices, while also providing sufficient semiconductor surface passivation to allow an adjustable barrier height. That is, the interface layer may allow passivation of surface states and reduction (or elimination) of MIGS in the semiconductor to allow for an adjustable barrier height with a substantially thin layer that allows sufficient current to be transferred across the interface layer.

As explained in the above-cited patent application, there are several methods by which the barrier height can be made adjustable. For example, adjustment may be made b tuning the degree of Fermi level pinning. In other words, some embodiments may allow for a sufficiently thin interface layer so that not all of the effects of MIGS in the semiconductor channel are eliminated. Further, the pinning may be varied by combinations of thickness of the interface layer and the choice of interface material. The metal in contact with the interface layer may be pinned by MIGS at different levels in different materials. Conversely, or in addition, the semiconductor channel passivation may be left incomplete to allow for an effective level of unpassivated states. Complete depinning of the Fermi level (that is removal of all surface states in the semiconductor channel including MIGS) is another option, in which case one could tune the barrier height simply by choosing a pure metal or an alloy that possesses the desired workfunction.

In summary then, one embodiment for fabricating a transistor on a semiconductor substrate includes: (1) forming a semiconductor oxide dielectric layer on a semiconductor substrate by oxidizing the semiconductor substrate; (2) forming a metal gate on the semiconductor oxide layer by depositing a layer of metal on the semiconductor oxide and removing a portion of the deposited layer of metal based on a lithographic exposure; (3) forming a metal oxide dielectric layer on exposed portions of the metal gate by oxidizing the metal gate; (4) forming a gate oxide dielectric by removing a portion of the semiconductor oxide layer that is protected by the metal oxide formed on the metal gate; (5) forming a semiconductor channel structure by removing a portion of the semiconductor substrate that is not protected by the metal oxide formed on the metal gate; (6) forming an undercut semiconductor channel containing a source undercut region for a source tip and a drain undercut region for a drain tip by removing a source tip portion of the semiconductor channel structure that is subjacent to a left-hand end of the gate oxide and extends underneath the gate oxide toward the channel top interior and removing a drain tip portion of the semiconductor channel structure that is subjacent to a right-hand end of the gate oxide and extends underneath the gate oxide toward the channel top interior; (7) forming a source seed layer on a left-hand side of the undercut semiconductor channel and forming a drain seed layer on a right-hand side of the undercut semiconductor channel by anisotropically depositing seed layer material so that seed layer material is not deposited on exposed sidewall surfaces of the undercut semiconductor channel and removing a portion of deposited seed layer material that is above the undercut semiconductor channel; (8) forming an interface layer on the exposed sidewall surfaces of the undercut semiconductor channel by covalently bonding at least a monolayer (or less) of passivation material to semiconductor atoms of the exposed sidewall surfaces of the undercut semiconductor channel; and (9) forming a source on a first side of the channel including on the passivation layer and within a first undercut corresponding to the removal of the first portion of the semiconductor channel structure and forming a drain on a second side of the channel including on the interface layer and within a second undercut corresponding to the removal of the second portion of the semiconductor channel structure.

IV. Alternative Arrangements

Figure 5A:
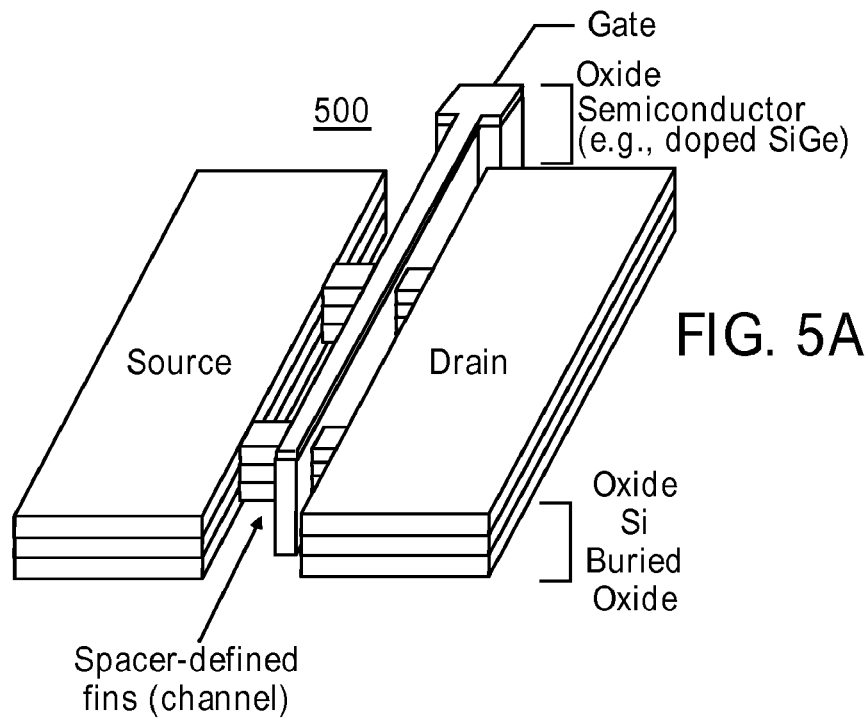
FIG. 5A illustrates portions of a conventional FinFET device.

The transistor illustrated in FIG. 4I is but one example of the types of FETs that can benefit from the present invention. Other FETs known in the art may also realize such benefits by incorporating the present interface layers into source/drain-channel junctions. For example, so-called FinFETs may incorporate such interface layers. A FinFET is an example of a thin-body SOI device and is the name given to a class of FETs developed by researchers at the University of California, Berkeley. Conventional FinFETs are described in detail in Yang-Kyu Choi et al., "Nanoscale CMOS Spacer FinFET for the Terabit Era", IEEE Electron Device Letters, vol. 2S, no. 1 (January 2002), incorporated herein reference, and an example of such a device SOO is illustrated in FIG. 5A. As shown, the channel of a finFET is formed by spacer-defined semiconductor fins.

Figure 5B:
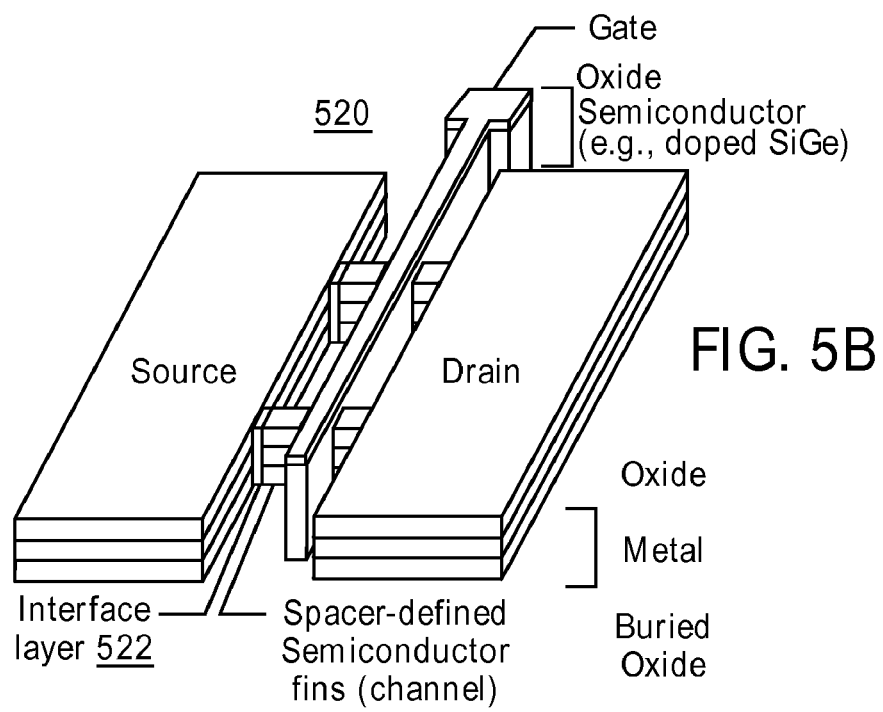
FIG. 5B illustrates portions of a FinFET device having interface layers between the source/drain and the channel in accordance with an embodiment of the present invention.

FIG. 5B shows a Fin-FET S 20 modified to incorporate interface layers 522 in accordance with an embodiment of the present invention. In this embodiment, the semiconductor source and/or drain are replaced with a metal source and/or drain. The semiconductor fins (i.e., the channel) contact these source/drain regions through an interface layer.

Figure 6A:
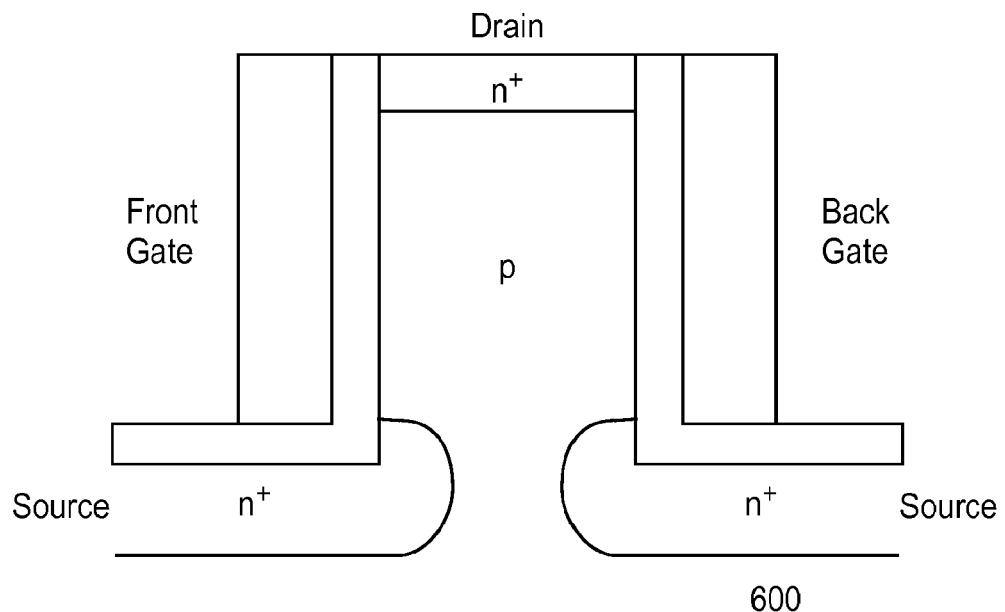
FIG. 6A illustrates portions of a conventional vertical MOSFET device.

Another transistor where the present invention may find application is the so-called vertical MOSFET, e.g., as described in E. Josse et al., "High performance 40 nm vertical MOSFET within a conventional CMOS process flow", 2001 Symposium on VLSI Technology Digest of Technical Papers. Paper No. 5B-2, pages 55-56 (2001), incorporated herein by reference. Vertical MOSFETs are characterized by a pillar-like channel sandwiched between a double gate. The source and drain are located at the ends of the channel pillar. An example of such a structure 600 is shown in FIG. 6A.

Figure 6B:
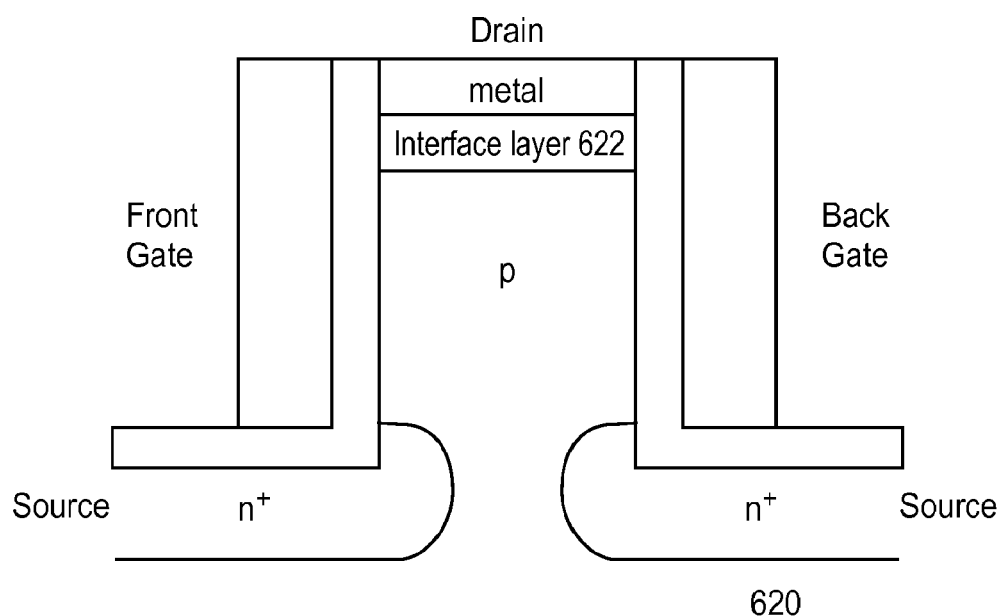
FIG. 6B illustrates portions of a vertical MOSFET device having interface layers between the source/drain and the channel in accordance with an embodiment of the present invention.

FIG. 6B shows a vertical MOSFET 620 modified to incorporate interface layers in accordance with an embodiment of the present invention. This transistor is similar to the MOSFET illustrated in FIG. 6A but the upper Si n-region (the drain in this example) has been replaced with a metal drain and contact to the channel is through an interface layer 622. Thus, such devices may be asymmetric, having a passivated Si/metal tunnel junction at the top contact, and a Si p-n junction at the bottom of the device on the substrate side. Complementary devices may be fabricated on the same substrate by first implanting p and n regions for the bottom contacts, and then employing two different metals, each with work functions chosen to yield p-type or n-type devices, as the top contacts to the channel.

Figure 7A:
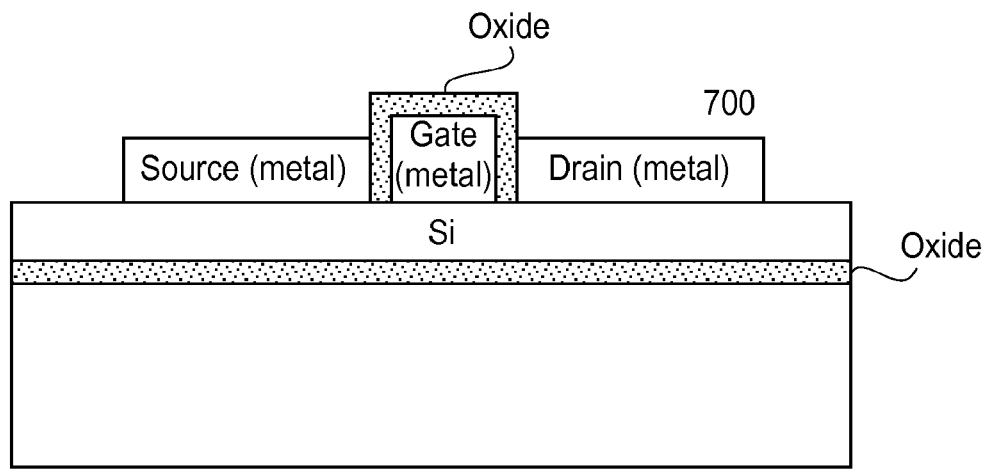
FIG. 7A illustrates portions of a conventional MESFET device.

FIG. 7A illustrates yet another type of transistor 700, the MESFET. A MESFET (Metal Semiconductor FET) replaces the gate/insulator/semiconductor stack adjacent to the channel with a metal/semiconductor contact, intentionally forming a Schottky barrier. The conductance of the channel is modulated when an applied gate voltage results in a change in the depletion width of the Schottky barrier into the channel. The channel as shown may be a thin Si layer, as in an 501 substrate.

Figure 7B:
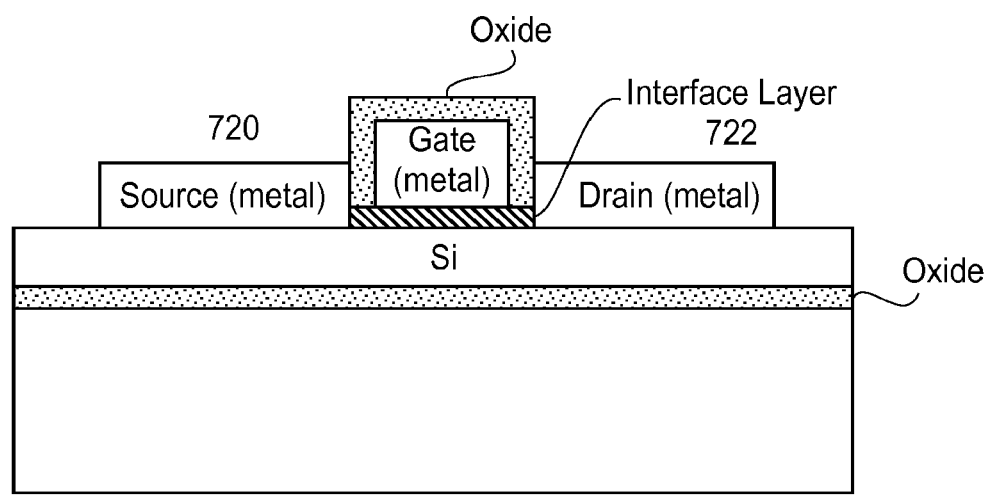
FIG. 7B illustrates portions of a MESFET device having an interface layer between the gate and the channel in accordance with an embodiment of the present invention.

For optimizing the utility of a particular MESFET application, it may be desirable to either raise or lower the Schottky barrier. This may be achieved as shown in FIG. 7B by implementation of the present invention in a transistor 720 wherein a particular interface dielectric and contact metal may be appropriately chosen. The interface dielectric forms an interface layer 722 between the gate and the channel. In other embodiments, the gate may be poly Si instead of a metal.

V. Use of Transistor in Electrical Systems

Transistors such as those described herein may be used in chips, integrated circuits, monolithic devices, semiconductor devices, microelectronic devices, and the like within a number of electrical systems. Electrical systems that are contemplated include computer systems (e.g., portable, laptop, desktop, server, mainframe, etc.), hard copy equipment (e.g., printer, plotter, fax machine, etc.), and other electrical systems. For example, in one embodiment a computer system may comprise a microprocessor having such a transistor to help execute instructions. The computer system may contain other conventional components including but not limited to a bus or other communication means to communicate information, a memory to store information (e.g., a dynamic memory such as RAM or a static memory such as ROM), a display device, a data input device, and a communication device such as a modem, as will he appreciated by a person having an ordinary level of skill in the art and the benefit of the present disclosure. Any or all of these devices may include transistors configured in accordance with the present invention.

Thus, a transistor having passivated junctions from the source to the channel and/or from the channel to the drain, and a method for forming such a transistor have been described. Although described with reference to specific embodiments it should be remembered that various modifications and changes may be made to the techniques described herein without departing from the broader spirit and scope of the invention. For example, metals other than aluminum may be used in transistors configured in accordance with the present invention. Low work function metals that may be so used include Er, Eu, Ba, Cs, Ca, Ce, Rb, Sm, Y, and Yb. All have workfunctions less than 3 eV. High work function metals (for aligning to valence bands) which may be used include Pt, Ir, Pd, Re, Ni, Co, and Au. The specification and drawings are accordingly to be regarded in an illustrative rather than a restrictive sense and the invention measured only in terms of the claims, which follow.

What is claimed is:

1. An insulated gate field effect transistor, comprising an insulated gate and an electrical junction, the electrical junction including a conductor, an n-type source semiconductor region and an interface layer disposed between said conductor and said n-type source semiconductor region, said interface layer including arsenic and a metal oxide and the electrical junction having a specific contact resistance less than or equal to approximately 1 $\Omega\text{-}\mu m^2$.

2. The transistor of claim 1, wherein the metal oxide comprises an oxide of the conductor.

3. An insulated gate field effect transistor, comprising an insulated gate and an electrical junction, the electrical junction including a conductor, an n-type source semiconductor region and an interface layer disposed between said conductor and said n-type source semiconductor region, said interface layer including arsenic and the electrical junction having a specific contact resistance less than or equal to approximately 1 $\Omega\text{-}\mu m^2$.

4. The transistor of claim 3, wherein the interface layer further includes a separation layer.

* * * * *